(12) United States Patent
Jung

(10) Patent No.: US 7,939,411 B2
(45) Date of Patent: May 10, 2011

(54) METHOD FOR FABRICATING SEMICONDUCTOR DEVICE WITH VERTICAL GATE

(75) Inventor: Young-Kyun Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/493,174

(22) Filed: Jun. 27, 2009

(65) Prior Publication Data

US 2010/0124812 A1  May 20, 2010

(30) Foreign Application Priority Data

Nov. 17, 2008  (KR) .................. 10-2008-0113983

(51) Int. Cl.
*H01L 21/336* (2006.01)

(52) U.S. Cl. ........ 438/270; 438/429; 438/701; 257/331; 257/E21.658

(58) Field of Classification Search .................. 438/429, 438/270, 701; 257/331, E21.658, E29.257
See application file for complete search history.

(56) References Cited

U.S. PATENT DOCUMENTS

| 2007/0080385 A1* | 4/2007 | Kim et al. ............ 257/296 |
| 2007/0082448 A1* | 4/2007 | Kim et al. ............ 438/268 |
| 2009/0230466 A1* | 9/2009 | Kim ..................... 257/331 |

FOREIGN PATENT DOCUMENTS

KR  102007003823  4/2007

OTHER PUBLICATIONS

Notice of Preliminary Rejection issued from Korean Intellectual Property Office on Oct. 25, 2010.

* cited by examiner

*Primary Examiner* — Matthew S Smith
*Assistant Examiner* — John M Parker
(74) *Attorney, Agent, or Firm* — IP & T Group LLP

(57) ABSTRACT

A method for fabricating a semiconductor device includes forming buried bit lines in a first substrate; forming a trench that separate the buried bit lines from each other; forming an interlayer insulation layer to gap-fill the trench; forming a second substrate over the first substrate gap-filled with the interlayer insulation layer; forming a protective pattern over the second substrate; forming a plurality of active pillars by etching the second substrate using the protective pattern as an etch barrier; and forming vertical gates surrounding sidewalls of the active pillars.

16 Claims, 14 Drawing Sheets

<ALIGNMENT>

<MISALIGNMENT>

METHOD FOR FABRICATING SEMICONDUCTOR DEVICE WITH VERTICAL GATE

CROSS-REFERENCE TO RELATED APPLICATIONS

The present application claims priority of Korean Patent Application No. 10-2008-0113983, filed on Nov. 17, 2008, the disclosure of which is incorporated herein by reference in its entirety.

BACKGROUND OF THE INVENTION

The present invention relates to a method for fabricating a semiconductor device, and more particularly, to a method for fabricating a semiconductor device with vertical gates.

Recently, a memory device with dimensions under 40 nm has been used to improve a degree of integration. However, it has been difficult to scale a transistor having a planar channel or a recess channel used in 8 $F^2$ or 6 $F^2$ cell architecture, where F is a minimum feature size, to have dimensions under 40 nm. Accordingly, a dynamic random access memory (DRAM) having 4 $F^2$ cell architecture, which can improve the degree of integration to 1.5 to 2 times in the same scaling, is desirable and thus a semiconductor device with vertical gates is suggested.

The semiconductor device with vertical gates is fabricated by processing a substrate to have a pillar-type active pillar and a vertical gate surrounding the external walls of the active pillar. In the semiconductor device with vertical gates, a channel stretched in a vertical direction is formed on areas between the upper part and lower part of the active pillar.

In the fabrication of the semiconductor device with vertical gates, a buried bit line (BBL) is formed by performing an ion implantation process, and a trench process is performed to separate neighboring buried bit lines each other.

FIG. 1A is a cross-sectional view illustrating a semiconductor device with vertical gates according to the prior art. Hereinafter a method for forming the semiconductor device with vertical gates according to the prior art will be described.

Referring to FIG. 1A, an active pillar 12 having recessed sidewalls is formed by etching a substrate 11 using a protective layer 13 as an etch barrier, and the recessed sidewall of each active pillar 12 is surrounded by the gate insulation layer 17 and a vertical gate 14.

An impurity region is formed in the substrate 11 by the ion implantation process, and the impurity region is separated by forming a trench 16. In the trench formation process, the substrate 11 is etched to a depth which can divide the impurity region. The separated impurity regions become buried bit lines 15A and 15B.

As described above, the buried bit lines 15A and 15B are formed by performing the ion implantation process and the trench formation process. A photoresist mask is used in the trench formation process. The photoresist mask is called as a 'BBL mask.'

FIG. 1B is a plan view illustrating a buried bit line according to the prior art. The buried bit lines 15A and 15B are separated each other by the trench 16.

Since etching process for separating the buried bit lines 15A and 15B is performed after the active pillar 12 is formed, it is comparatively easy to find a misalignment between the active pillar 12 and the trench 16.

FIG. 2A is a scanning electron microscopic view showing a BBL mask alignment; FIG. 2B is a scanning electron microscopic view showing a BBL mask misalignment; and FIG. 2C is a scanning electron microscopic view showing a damage of the protective layer due to the BBL mask misalignment.

If a misalignment occurs, the trench 16 is misaligned with the active pillar 12 as shown in FIG. 2B, or the protective layer 13 formed over the active pillar 12 is damaged and overlaid (see reference A) during an etching process for the trench formation as shown in FIG. 2C. Therefore, it is desirable for a new process to prevent the above overlay and align the trench and the active pillar.

SUMMARY OF THE INVENTION

An embodiment of the present invention is directed to providing a method for fabricating a semiconductor device with vertical gates that can fundamentally prevent misalignment between an active pillar and a trench for separating buried bit lines.

Another embodiment of the present invention is directed to providing a method for fabricating a semiconductor device with vertical gates that can prevent a damage of a protective layer formed over the active pillar.

In accordance with an aspect of the present invention, there is provided a method for fabricating a semiconductor device, including: forming buried bit lines separated from each other by a respective trench in a substrate; forming a plurality of active pillars over the buried bit line; and forming vertical gates surrounding sidewalls of the active pillars.

The forming of the plurality of active pillars may include forming an active pillar substrate over the substrate including the buried bit lines; forming a protective layer over the active pillar substrate; etching the protective layer by using a first mask used for forming the trench; etching the protective layer by using a second mask that crosses the first mask to thereby form a protective pattern; and etching the active pillar substrate by using the protective pattern as an etch barrier.

In accordance with another aspect of the present invention, there is provided a method for fabricating a semiconductor device, including: forming buried bit lines in a first substrate; forming a trench that separate the buried bit lines from each other; forming an interlayer insulation layer to gap-fill the trench; forming a second substrate over the first substrate gap-filled with the interlayer insulation layer; forming a protective pattern over the second substrate; forming a plurality of active pillars by etching the second substrate using the protective pattern as an etch barrier; and forming vertical gates surrounding sidewalls of the active pillars.

The forming of the protective pattern may include forming a protective layer over the second substrate; etching the protective layer by using a first mask used for forming the trench; and etching the protective layer by using a second mask that crosses the first mask to thereby form the protective pattern.

DESCRIPTION OF SPECIFIC EMBODIMENTS

Figure 1A:
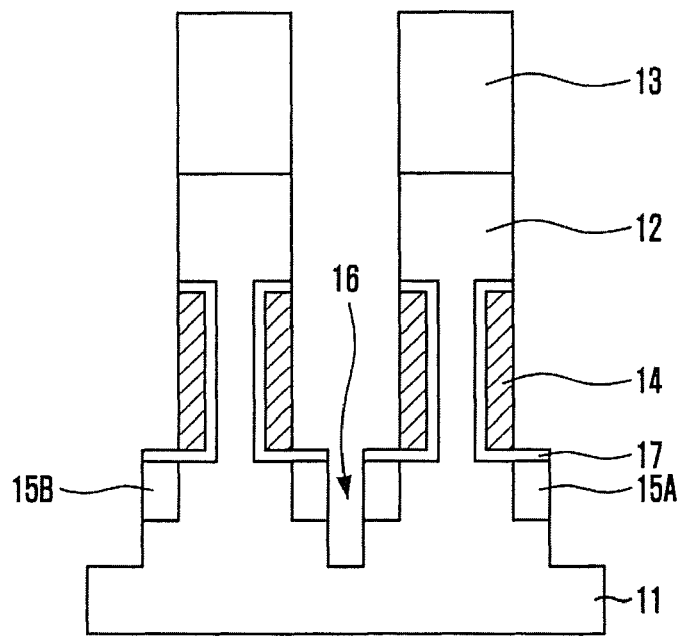
FIG. 1A is a cross-sectional view illustrating a semiconductor device with vertical gates according to the prior art.
Figure 1B:
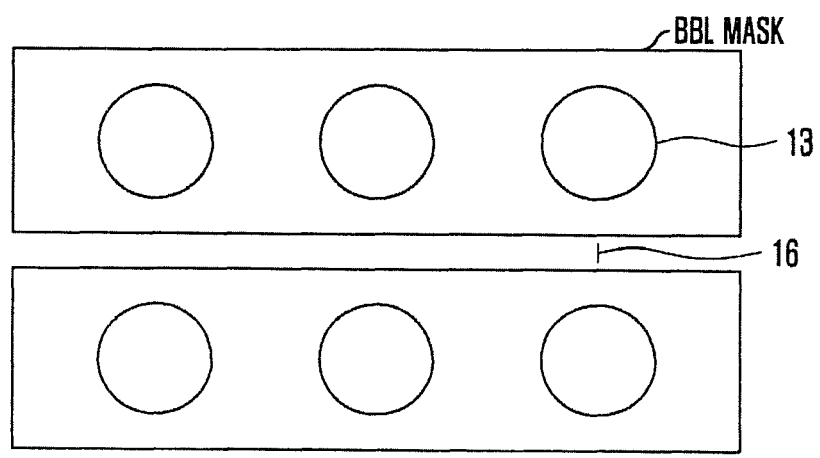
FIG. 1B is a plan view illustrating a buried bit line according to the prior art.
Figure 2A:
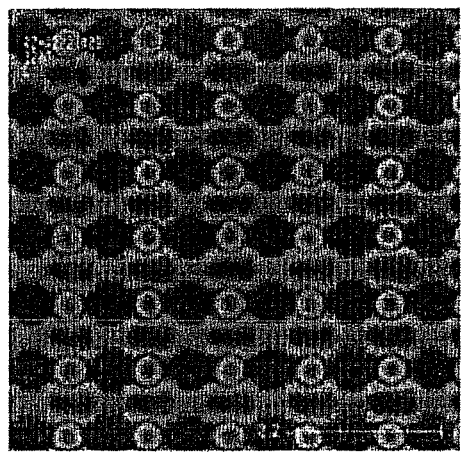
FIG. 2A is a scanning electron microscopic view showing a buried bit line mask alignment.
Figure 2B:
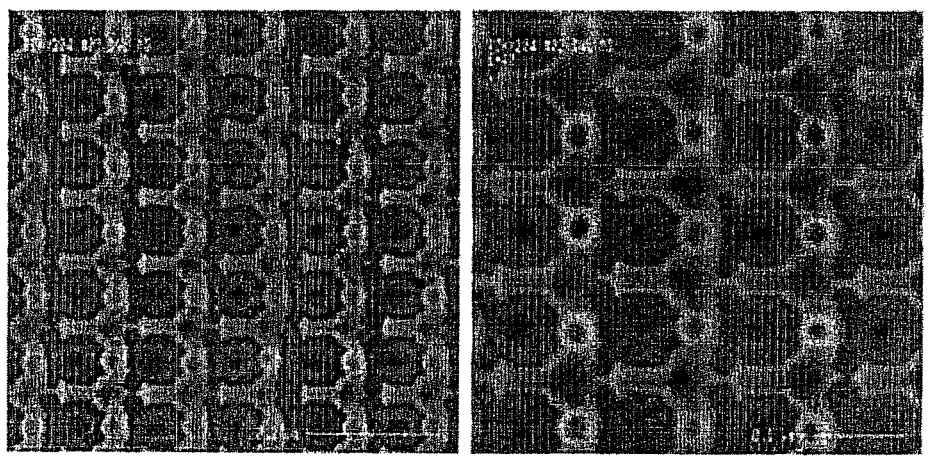
FIG. 2B is a scanning electron microscopic view showing a buried bit line mask misalignment.
Figure 2C:
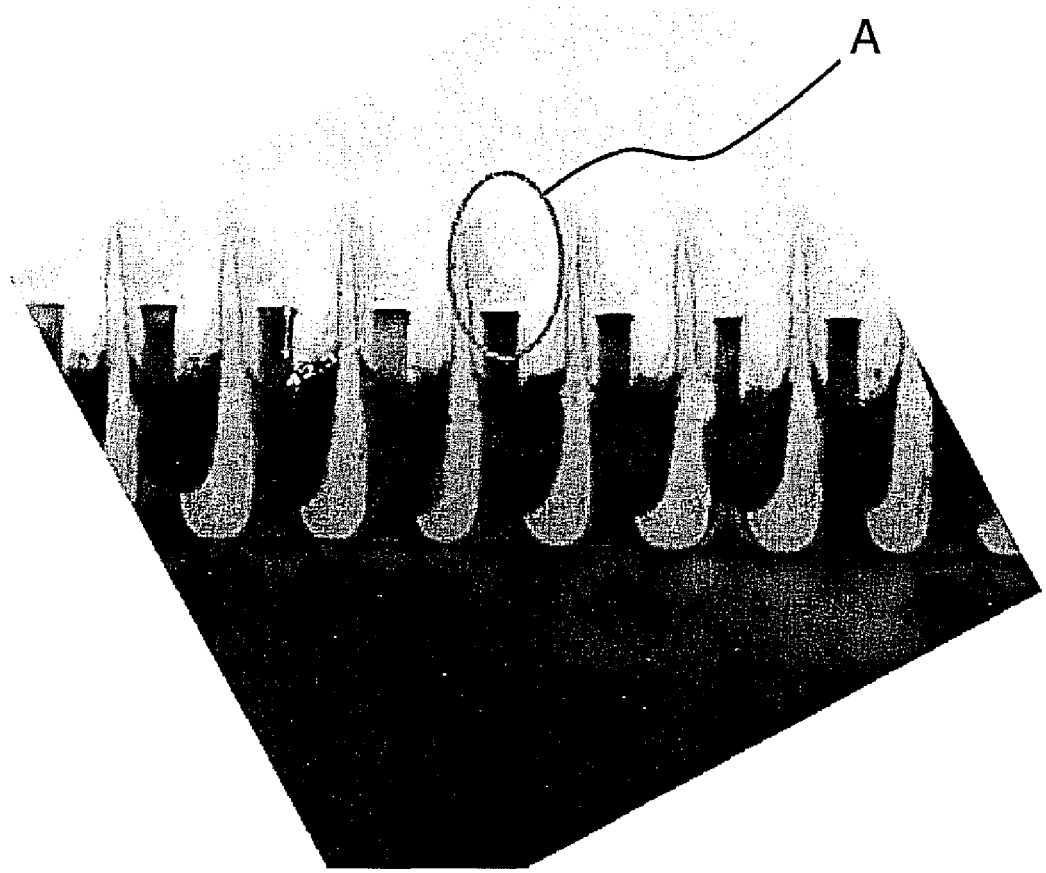
FIG. 2C is a scanning electron microscopic view showing a damage of the protective layer due to the BBL mask misalignment.

Other objects and advantages of the present invention can be understood by the following description, and become apparent with reference to the embodiments of the present invention.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, even if they appear in different embodiments or drawings of the present invention.

FIGS. 3A to 13B are diagrams illustrating a method for fabricating a semiconductor device with vertical gates in accordance with an embodiment of the present invention. FIGS. 3A, 4A, 5A, 6A, 7A, 8A, 9A, 10A, 11A, 12A and 13A are cross-sectional views of the semiconductor device; and FIGS. 3B, 4B, 5B, 6B, 7B, 8B, 9B, 10B, 11B and 12B are plan views of the semiconductor device corresponding to FIGS. 3A, 4A, 5A, 6A, 7A, 8A, 9A, 10A, 11A and 12A, respectively.

Figure 3A:
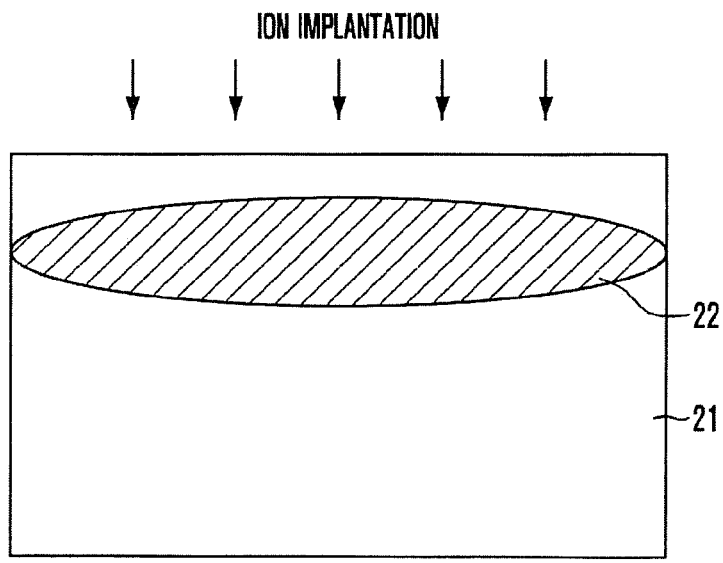
FIGS. 3A to 13B are diagrams illustrating a method for fabricating a semiconductor device with vertical gates in accordance with an embodiment of the present invention
Figure 3B:
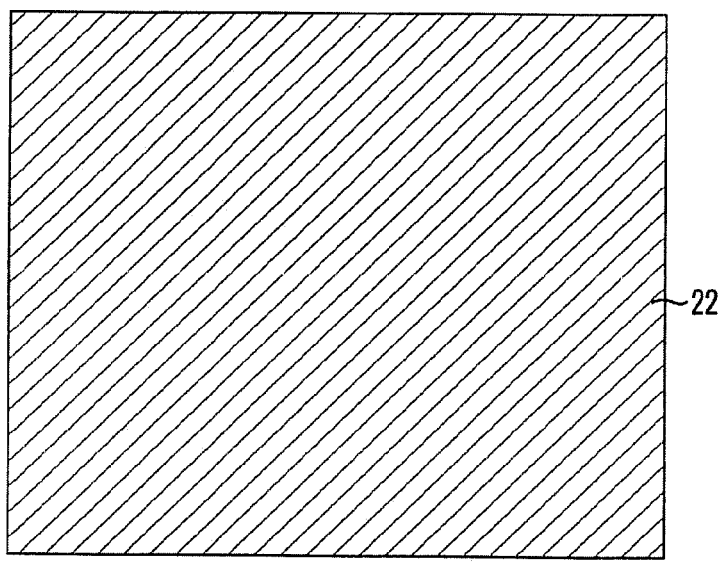

Referring to FIGS. 3A and 3B, an impurity region 22 is formed by performing an impurity ion implantation on a first substrate 21. The impurity may be phosphorous (Ph) or arsenide (As). The first substrate 21 may include a silicon layer. The impurity region 22 is used as buried bit lines.

Figure 4A:
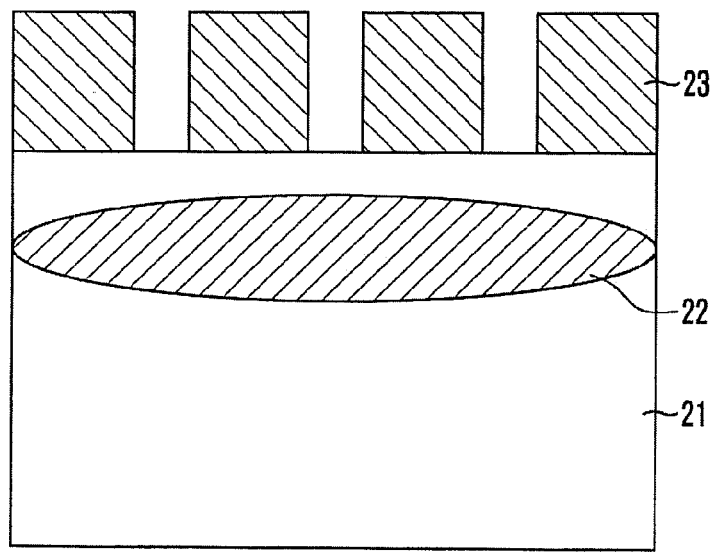
Figure 4B:
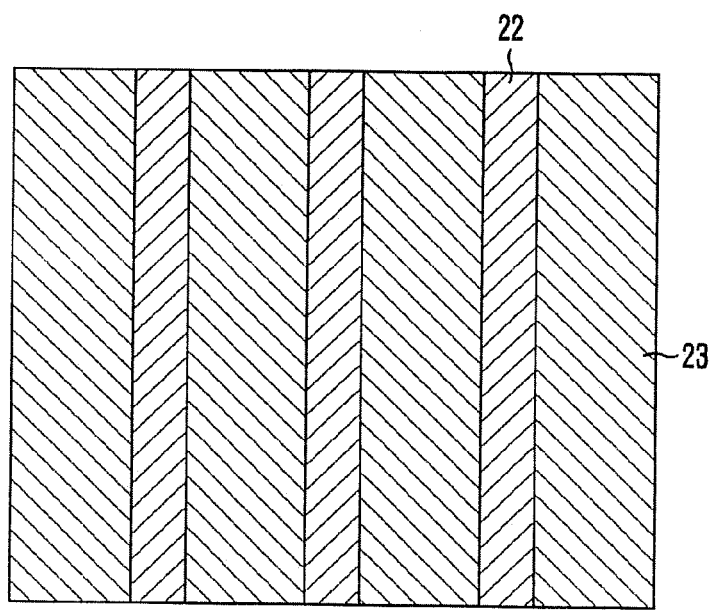

Referring to FIGS. 4A and 4B, the first mask 23 is formed over the first substrate 21 by using a first photoresist layer. The first mask 23 is patterned as lines with spacing in-between, and the first mask 23 is used as a buried bit line (BBL) mask for separating the buried bit lines.

Figure 5A:
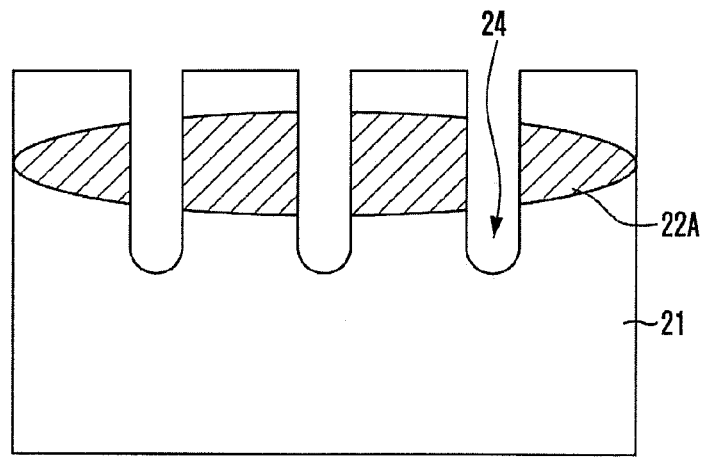
Figure 5B:
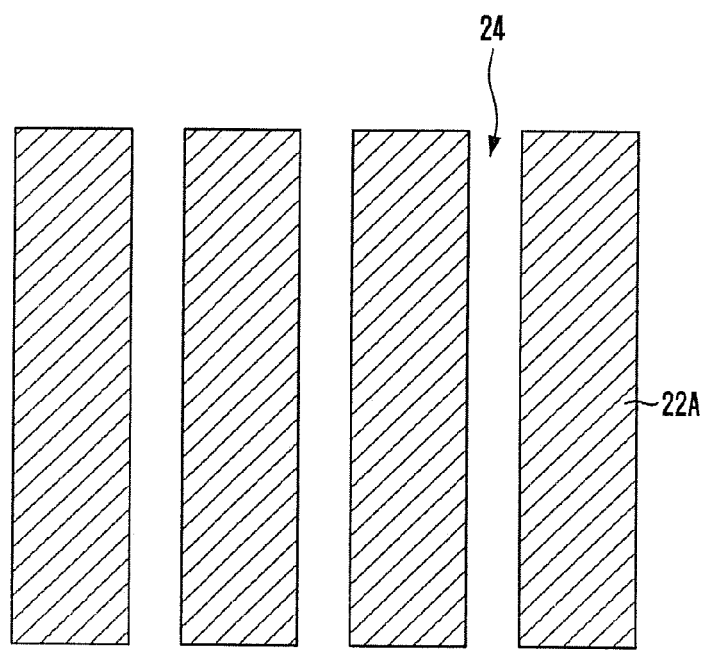

Referring to FIGS. 5A and 5B, a trench 24 is formed by etching the first substrate 21 to a depth which can separate the impurity region 22 by using the first mask 23 as an etch barrier. Then, the first mask 23 is stripped.

As described, the impurity region 22 is separated by the trench 24 to form buried bit lines 22A.

Figure 6A:
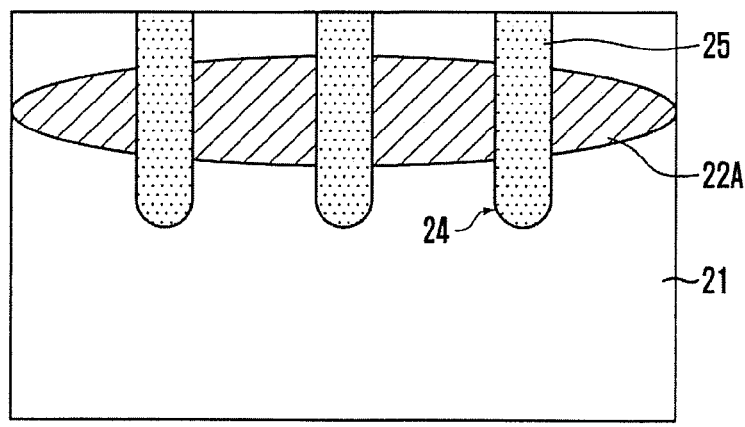
Figure 6B:
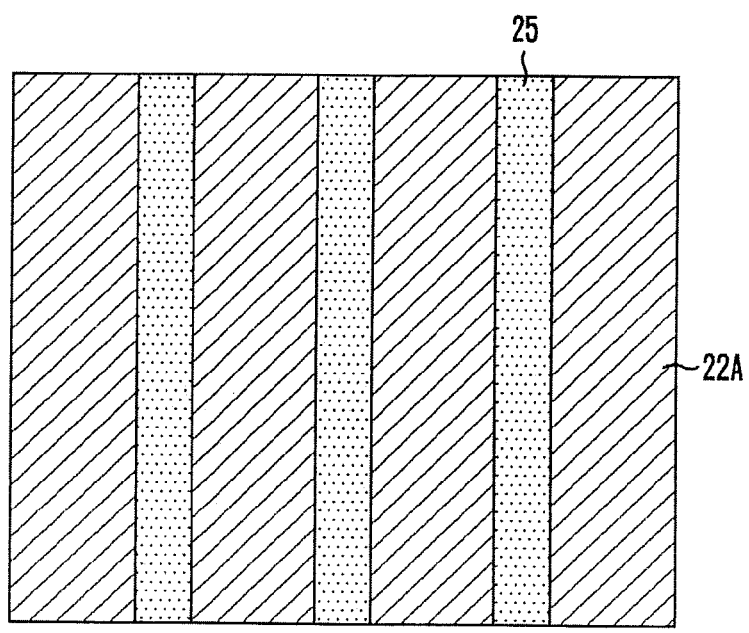

Referring to FIGS. 6A and 6B, an interlayer insulation layer 25 is formed to gap-fill the trench 24. The interlayer insulation layer 25 may include an oxide layer having a good gap-fill characteristic such as boro phosphorous silicate glass (BPSG). The interlayer insulation layer 25 insulates between adjacent buried bit lines 22A.

Then, the interlayer insulation layer 25 is planarized until the first substrate 21 is exposed. The planarization process includes a chemical mechanical polishing (CMP) process.

Figure 7A:
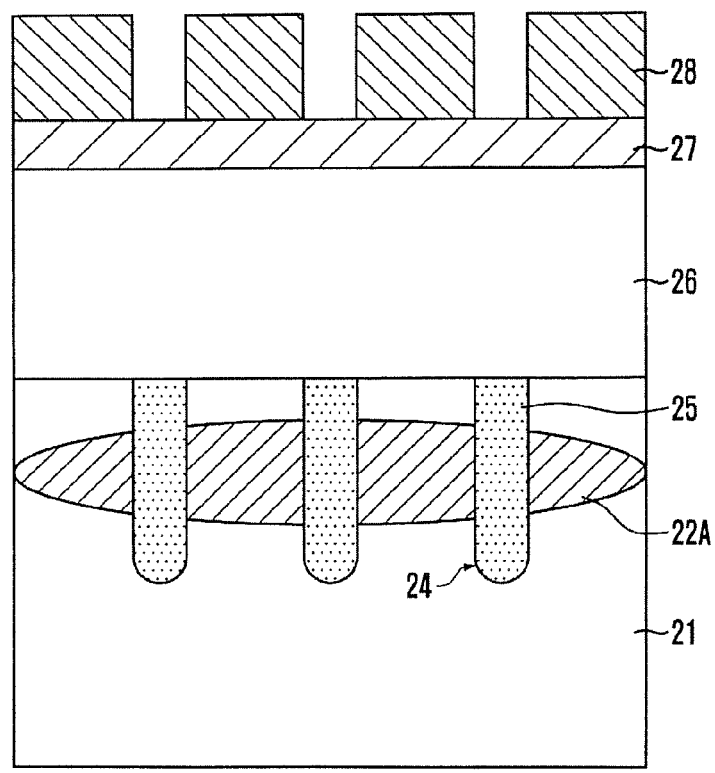
Figure 7B:
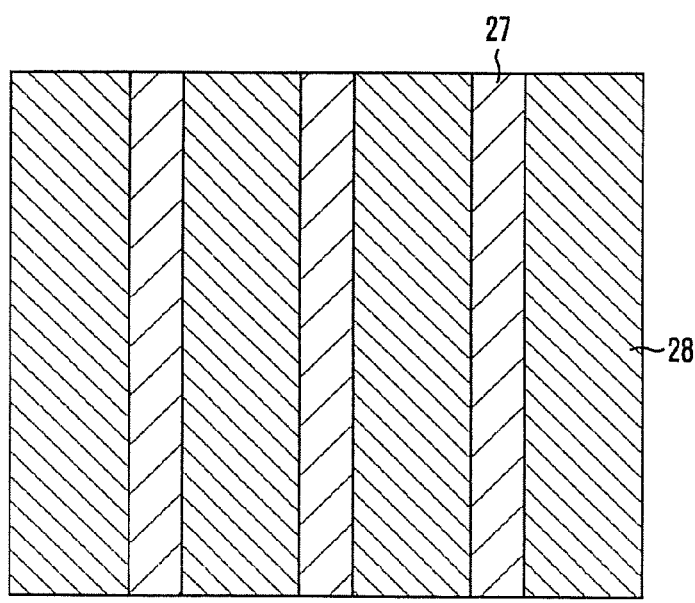

Referring to FIGS. 7A and 7B, a second substrate 26 is formed over the first substrate 21. The second substrate 26 may be formed using an epitaxial growth method, and thus, the second substrate 26 may be a silicon epitaxial layer. The silicon epitaxial layer may be formed by a selective epitaxial growth (SEG) method using a silicon source such as $SiH_4$. During the SEG process, process temperature is at least 15° C. or more, and an impurity having a predetermined concentration may be doped in order to provide a channel.

The second substrate 26 may be used to form the active pillars by the subsequent etching processes. Therefore, the thickness of the second substrate 26 may be controlled by considering the height of the active pillars.

A protective layer 27 is formed over the second substrate 26. The protective layer 27 may be formed of a nitride layer. The protective layer 27 is used as an etch barrier during the subsequent etching processes.

The second mask 28 is formed over the protective layer 27 by using a second photoresist layer. The second mask 28 is patterned as lines with spacing in-between. The second mask 28 has the same shape of the first mask 23 shown in FIGS. 4A and 4B. Thus, there is no misalignment between the first mask 23 and the second mask 28. That is, since the alignment of the lower layer is carried with the first mask 23, an overlay error is prevented/reduced.

Figure 8A:
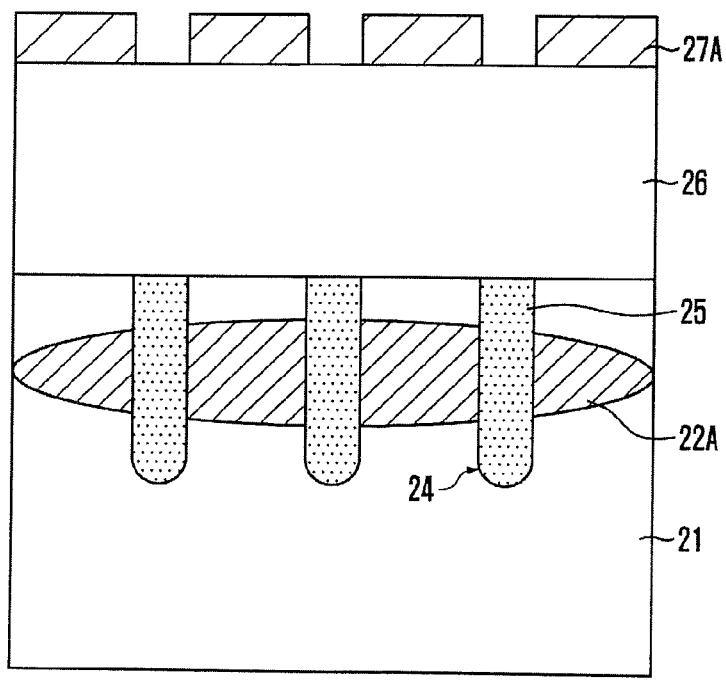
Figure 8B:
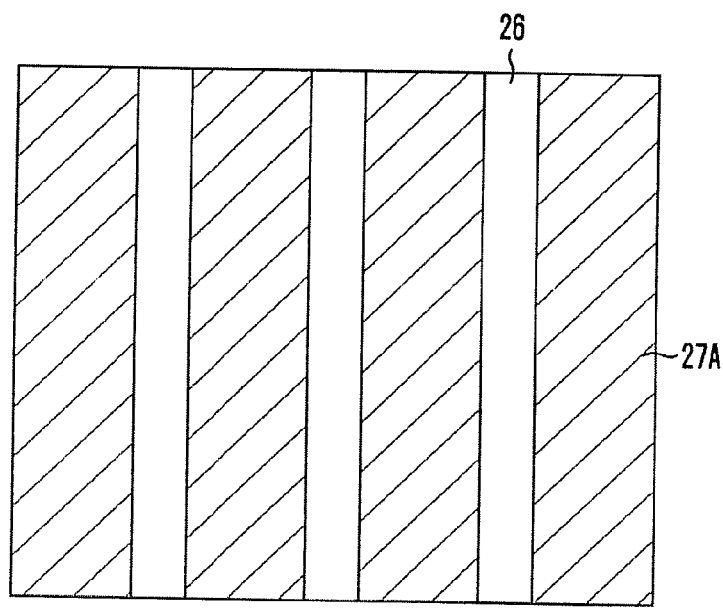

Referring to FIGS. 8A and 8B, the protective layer 27 is etched by using the second mask 28 as an etch barrier. Thus, the protective layer 27 is patterned as lines with spacing in-between to form a first protective pattern 27A. A recipe having a high selectivity of the protective layer 27 with respect to the second substrate 26 is applied during the etching process of the protective layer 27.

The first protective pattern 27A is overlapped to have the same shape with the buried bit lines 22A in a plane view.

Then, the second mask 28 is stripped.

Figure 9A:
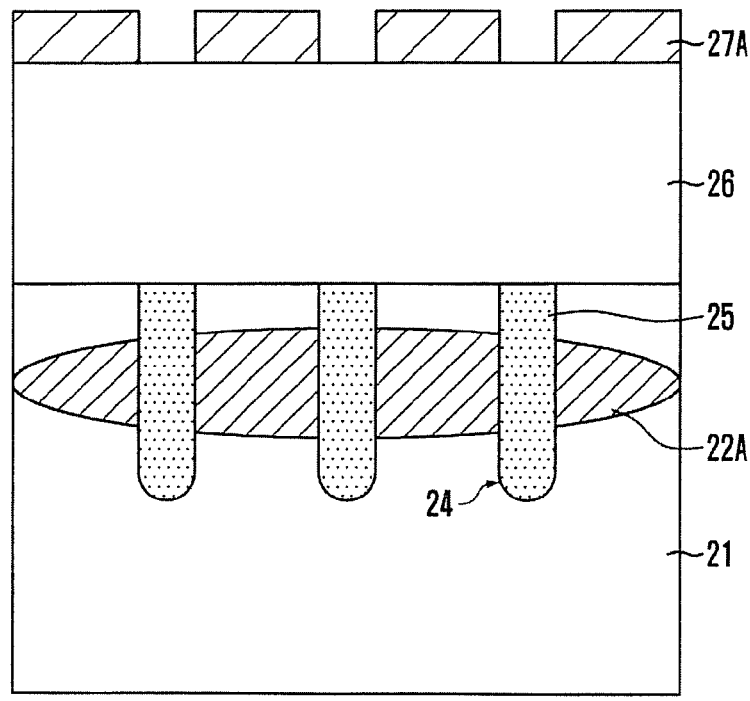
Figure 9B:
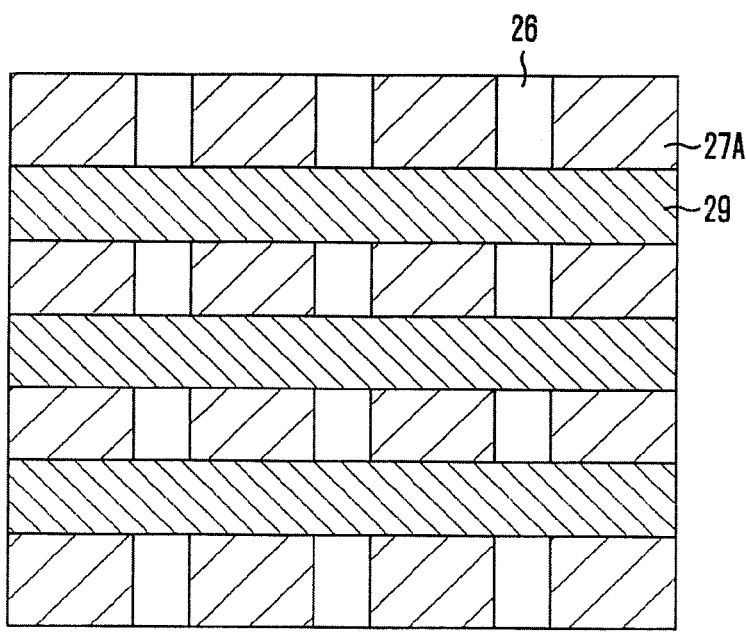

Referring to FIGS. 9A and 9B, a third mask 29 is formed over the first protective pattern 27A. The third mask 29 is patterned as lines with spacing in-between, and is perpendicular to the second mask 28 shown in FIGS. 7A and 7B. Generally, the third mask 29 is called as a damascene wordline mask (DWM). The third mask 29 is formed to cross the entire surface in FIG. 9A, and the third mask 29 is perpendicular to the first protective pattern 27A in FIG. 9B.

Figure 10A:
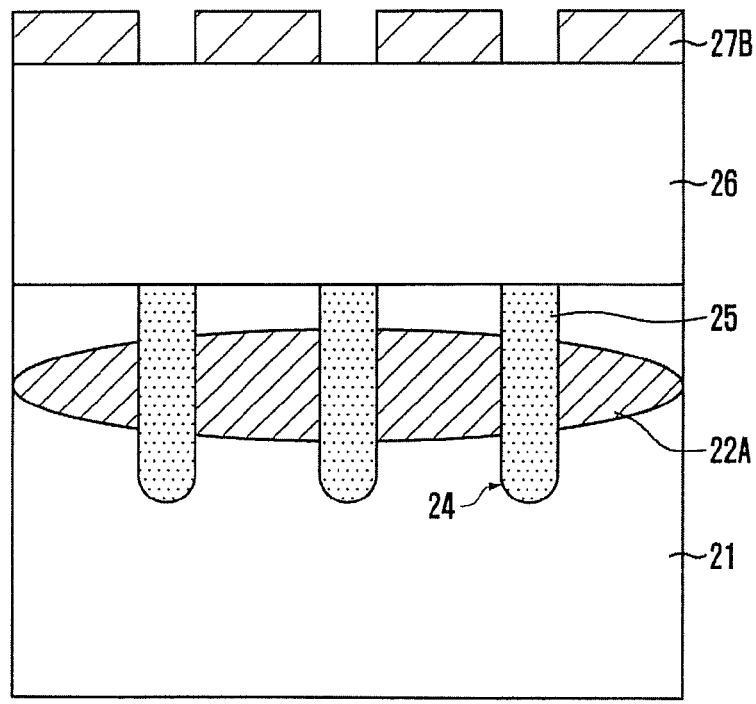
Figure 10B:
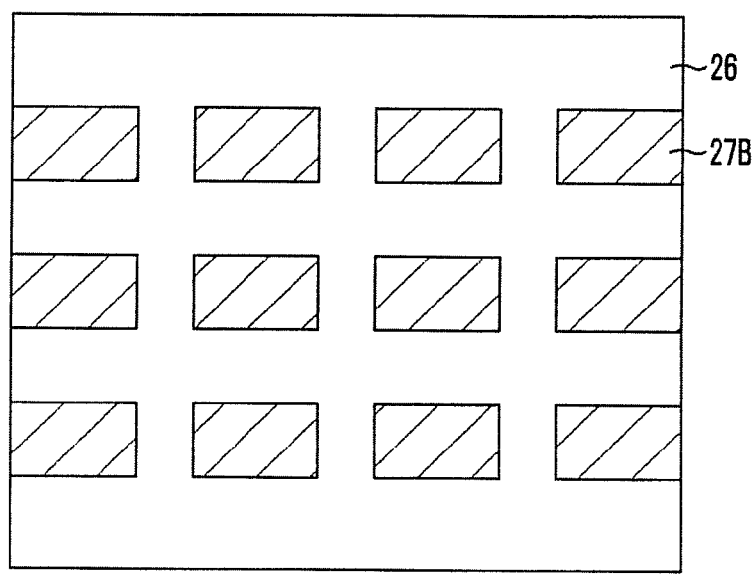

Referring to FIGS. 10A and 10B, the first protective pattern 27A is etched by using the third mask 29 as an etch barrier to form a second protective pattern 27B. The second protective pattern 27B is a matrix shape corresponding to active pillars to be formed.

Then, the third mask 29 is stripped.

Figure 11A:
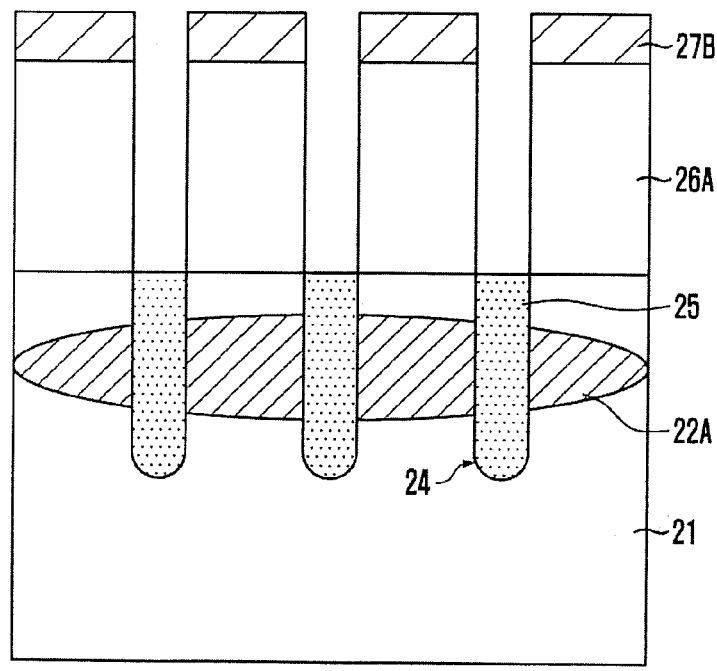
Figure 11B:
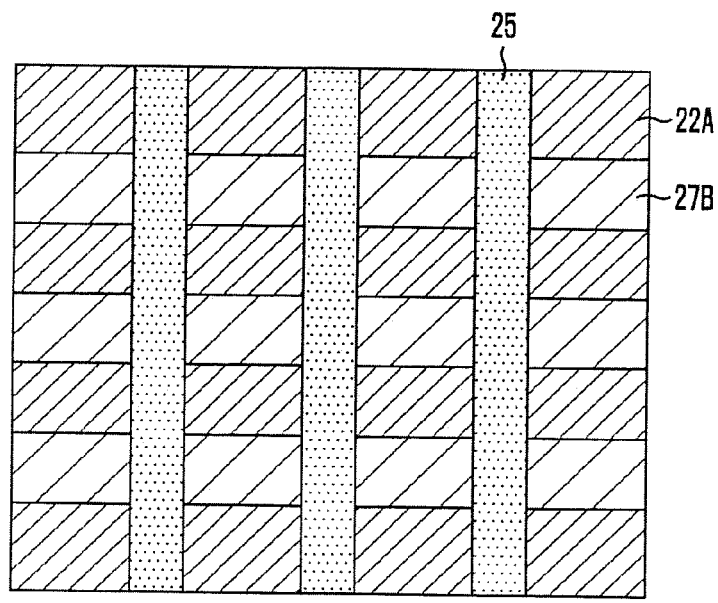

Referring to FIGS. 11A and 11B, the second substrate 26 is etched by using the second protective pattern 27B as an etch barrier to form the active pillars 26A.

By etching the second substrate 26, the surface of the interlayer insulation layer 25 filled in the trench 24 is exposed, and the first substrate 21 is exposed.

Figure 12A:
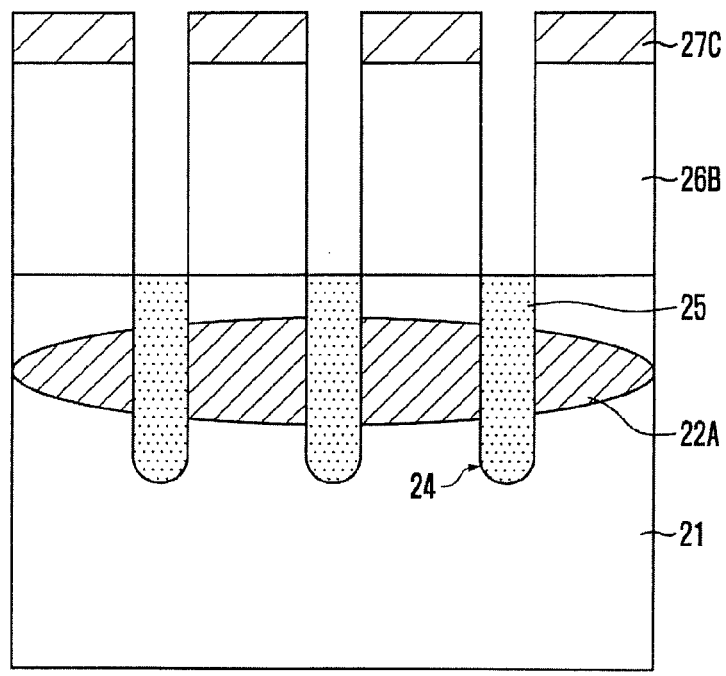
Figure 12B:
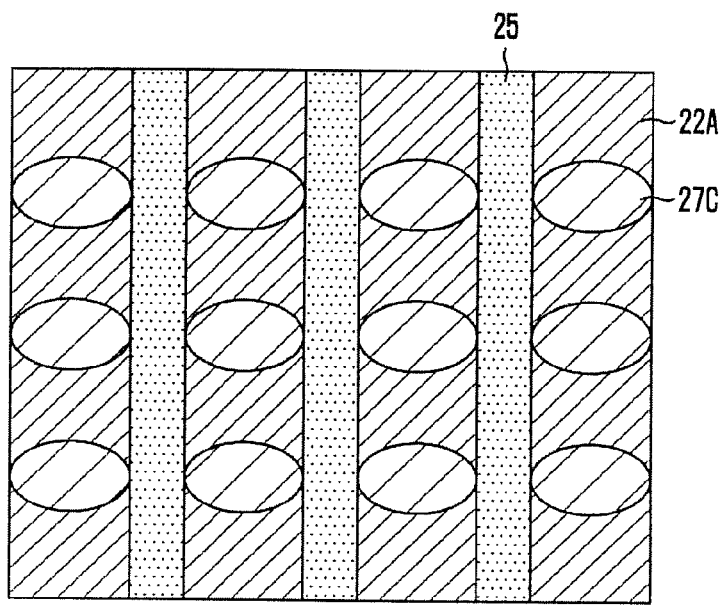

Referring to FIGS. 12A and 12B, during the etching process, the rectangular shaped second protective pattern 27B and the rectangular shaped active pillars 26A shown in FIGS. 11A and 11B become a circular shaped protective pattern and a circular shaped active pillars. As a result, an elliptical second protective pattern 27C and the elliptical active pillars 26B are formed.

Figure 13A:
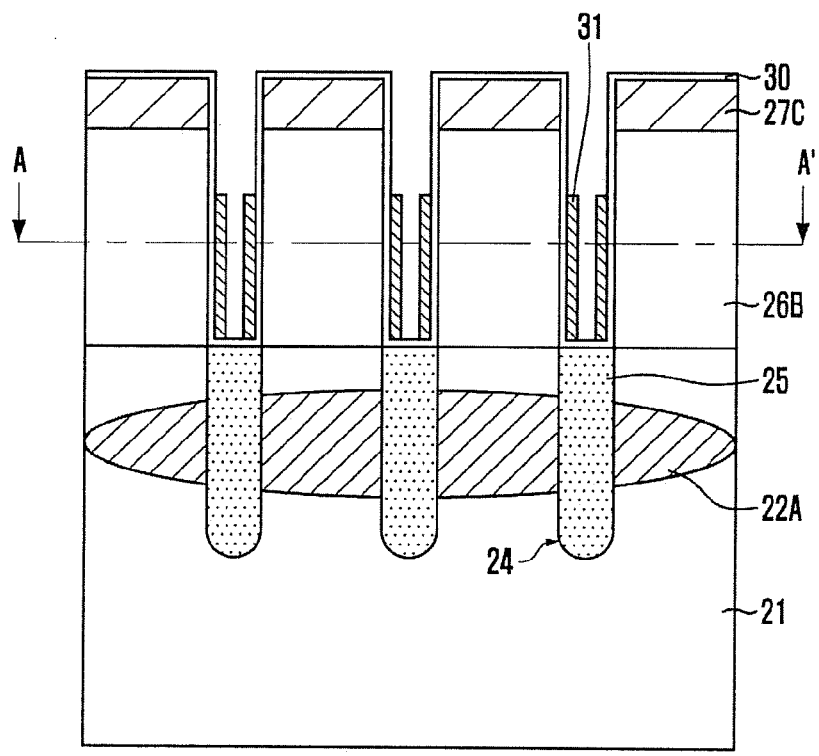
Figure 13B:
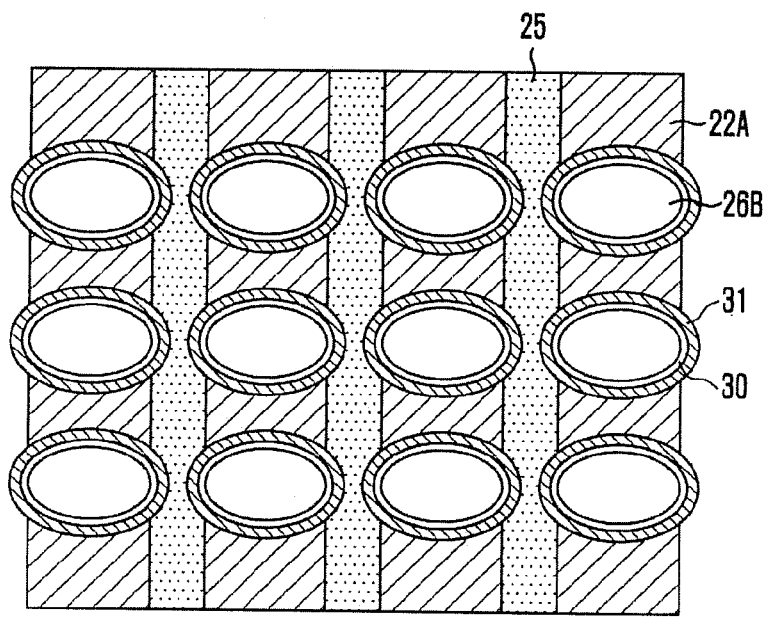

Referring to FIGS. 13A and 13B, vertical gates 31 surround sidewalls of the elliptical active pillars 26B. Portions of the sidewalls of the elliptical active pillars 26B may be recessed, and a gate insulation layer 30 may be formed on sidewalls of the elliptical active pillars 26B before forming the vertical gates 31. Herein, FIG. 13B is a plan view showing the semiconductor device of FIG. 13A taken along a line A-A'.

The vertical gates 31 are formed by depositing a gate conductive layer over the substrate structure having the elliptical active pillars 26B and performing an etch-back process onto the gate conductive layer. The gate conductive layer may include a polysilicon layer or a metal layer. The metal layer may include a titanium nitride (TiN) layer or a tungsten (W) layer. The tungsten layer has a thickness at least 50 Å or more. Also, the tungsten layer is deposited with a temperature at least 15° C. or more.

The method of the present invention prevent misalignment between an active pillar and a trench by forming buried bit lines and performing the trench formation process for separate the buried bit lines before the active pillar is formed.

Also, the method of the present invention can stably form the active pillar without a damage of a protective pattern by performing the trench formation process for separate the buried bit lines before the active pillar is formed.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming buried bit lines separated from each other by a respective trench in a substrate before a plurality of active pillars are formed;
    forming the plurality of active pillars over the buried bit lines; and
    forming vertical gates surrounding sidewalls of the active pillars.

2. The method of claim 1, wherein the forming of the plurality of active pillars includes:
    forming an active pillar substrate over the substrate including the buried bit lines;
    forming a protective layer over the active pillar substrate;
    etching the protective layer by using a first mask for forming the trench;
    etching the protective layer by using a second mask that crosses the first mask to thereby form a protective pattern; and
    etching the active pillar substrate by using the protective pattern as an etch barrier.

3. The method of claim 2, wherein the first mask and the second mask are photoresist patterns formed of lines with spacing in-between.

4. The method of claim 2, wherein the protective pattern includes a nitride layer or an oxide layer.

5. The method of claim 1, wherein the active pillar substrate is formed by using an epitaxial growth method.

6. The method of claim 2, wherein the active pillar substrate includes an epitaxial silicon layer.

7. The method of claim 1, wherein the substrate includes a silicon layer.

8. The method of claim 1, wherein the buried bit lines is formed by performing an impurity ion implantation.

9. A method for fabricating a semiconductor device, comprising:
    forming buried bit lines in a first substrate before a plurality of active pillars are formed;
    forming a trench that separate the buried bit lines from each other;
    forming an interlayer insulation layer to gap-fill the trench;
    forming a second substrate over the first substrate gap-filled with the interlayer insulation layer;
    forming a protective pattern over the second substrate;
    forming the plurality of active pillars by etching the second substrate using the protective pattern as an etch barrier; and
    forming vertical gates surrounding sidewalls of the active pillars.

10. The method of claim 9, wherein the forming of the protective pattern includes:
    forming a protective layer over the second substrate;
    etching the protective layer by using a first mask for forming the trench; and
    etching the protective layer by using a second mask that crosses the first mask to thereby form the protective pattern.

11. The method of claim 10, wherein the first mask and the second mask are photoresist patterns that form lines with spacing in-between.

12. The method of claim 10, wherein the protective pattern includes a nitride layer or an oxide layer.

13. The method of claim 9, wherein the second substrate is formed by using an epitaxial growth method.

14. The method of claim 9, wherein the second substrate includes an epitaxial silicon layer.

15. The method of claim 9, wherein the first substrate includes a silicon layer.

16. The method of claim 9, wherein the buried bit lines are formed by performing an impurity ion implantation.

* * * * *

UNITED STATES PATENT AND TRADEMARK OFFICE
CERTIFICATE OF CORRECTION

| | | |
|---|---|---|
| PATENT NO. | : 7,939,411 B2 | |
| APPLICATION NO. | : 12/493174 | |
| DATED | : May 10, 2011 | |
| INVENTOR(S) | : Young-Kyun Jung | |

It is certified that error appears in the above-identified patent and that said Letters Patent is hereby corrected as shown below:

On the title page, item [56] change FOREIGN PATENT DOCUMENTS of section [56] for References Cited as follows:

FOREIGN PATENT DOCUMENTS

KR    1020070038233    4/2007

Signed and Sealed this
Thirteenth Day of September, 2011

David J. Kappos
*Director of the United States Patent and Trademark Office*